United States Patent [19]

Carey et al.

[11] Patent Number: 5,289,346
[45] Date of Patent: Feb. 22, 1994

[54] PERIPHERAL TO AREA ADAPTER WITH PROTECTIVE BUMPER FOR AN INTEGRATED CIRCUIT CHIP

[75] Inventors: David H. Carey; Barry H. Whalen, both of Austin, Tex.

[73] Assignee: Microelectronics and Computer Technology Corporation, Austin, Tex.

[21] Appl. No.: 17,580

[22] Filed: Feb. 16, 1993

Related U.S. Application Data

[63] Continuation of Ser. No. 887,198, May 21, 1992, abandoned, which is a continuation of Ser. No. 661,579, Feb. 26, 1991, abandoned.

[51] Int. Cl.$^5$ .......................... H05K 7/02; H01R 9/09
[52] U.S. Cl. ..................................... 361/777; 257/778; 361/749; 361/760; 361/807; 437/209; 439/68; 439/69
[58] Field of Search ............... 257/723, 724, 777, 778; 228/180.2; 361/393, 395, 396, 400, 403, 409, 411, 412, 417; 437/209; 439/44, 65, 66, 68, 69, 74, 83

[56] References Cited

U.S. PATENT DOCUMENTS 4,975,765 12/1990 Ackermann et al. ............... 257/778
5,029,325 7/1991 Higgins, III et al. ............... 257/778

FOREIGN PATENT DOCUMENTS 2586885 3/1987 France ................................ 361/386
1-293528 11/1989 Japan ................................ 257/728

OTHER PUBLICATIONS

Siemens Forsch-u Entwickl-Ber. Bd 17 (1988) Nr. 5.

Primary Examiner—Leo P. Picard
Assistant Examiner—Donald A. Sparks
Attorney, Agent, or Firm—David M. Sigmond

[57] ABSTRACT

An peripheral to area adapter for an integrated circuit chip. The adapter comprises pads on an upper surface of a support in a pattern corresponding to the terminals on a integrated circuit, planar reroute lines on the upper surface with first ends at the pads, and vertical conductive vias extending through the support. The vias are connected at the upper surface to the second ends of the reroute lines. The vias are connected at the lower surface of the support to an area array of coupling elements. A protective bumper attached to the sides of the package provides mechanical shielding for the chip. The pads and reroute lines can be fabricated on a tape-automated-bonding (TAB) frame support and personalized to match a particular configuration of terminals or bumps on a chip. The coupling elements can form a generic array compatible with a wide variety of interconnect substrates.

26 Claims, 5 Drawing Sheets

PERIPHERAL TO AREA ADAPTER WITH PROTECTIVE BUMPER FOR AN INTEGRATED CIRCUIT CHIP

CROSS-REFERENCE TO RELATED APPLICATIONS

This is a continuation of U.S. Ser. No. 07/887,198 filed May 21, 1992, which is a continuation of U.S. Ser. No. 07/661,579 filed Feb. 26, 1991 both now abandoned. These applications are incorporated herein by reference.

BACKGROUND OF THE INVENTION

1. Field of the Invention

The present invention relates to a carrier adapter for use between an integrated circuit chip with peripheral terminals and an underlying substrate with area-patterned bond sites, and more particularly to an adapter with mating pads on the top surface of the adapter that can be aligned with, connected directly with and bonded to peripheral terminals on a chip, reroute lines on the top surface of the adapter with first ends connected to the pads, and vertical through-vias connected to the second ends of the reroute lines that terminate at coupling elements in an array pattern on the bottom of the adapter.

2. Description of the Related Art

Current multi-chip circuitry design requires attachment of numerous electronic devices to an electrical interconnect substrate. Terminals on the electrical devices can be connected to pads on the surface of the substrates. The substrate can further include buried metal lines which interconnect selected pads, thereby providing electrical interconnection for the electronic devices.

Typically the conductive terminals on a high density integrated circuit chip are distributed over a very small area along the periphery of the top surface of the chip. Flip-chip bonding involves inverting the chip, aligning the terminals on the chip with pads on the substrate, contacting the terminals to the pads and then bonding the terminals to the pads.

There also exist adapters which can be sandwiched between an inverted integrated circuit and an underlying interconnect substrate. In particular, existing adapters can translate the conductive terminals on a chip to an array pattern of coupling elements, to be bonded to the substrate, which can be positioned inside the area of the chip and have substantially larger bonding faces than the terminals. The array pattern of coupling elements can also have generic configurations and dimensions suitable for a wide variety of substrates.

Kyocera has developed an adapter which uses the internal layers of a multilayer ceramic carrier to accomplish the translation, but must modify the ceramic fabrication process in order to customize the adapter for a terminal configuation. An adapter by Fujitsu connects the inner ends of bent leads to the terminals on the bottom of a chip, and the outer ends of the bent leads to the pads on an adapter, but requires two bonding steps for each terminal.

Accordingly, there exists a need for an improved adapter capable of providing periperal to area translation for the terminals on an integrated circuit chip.

SUMMARY OF THE INVENTION

An object of the present invention is to provide an adapter for integrated circuit chips that contains pads on the top surface customized to directly contact the conductive peripheral terminals on a specific integrated circuit chip, planar reroute lines on the top surface that are customized to translate the terminals into a standardized array pattern, and vias through a dielectric support that connects the reroute lines to coupling elements on the bottom of the adapter. All of the peripheral to area translation for the terminals is performed by the reroute lines.

Another object of the present invention is to improve the assembly and testability of an integrated circuit-interconnect substrate structure without a substantial real estate penalty.

A further object of the present invention is to provide an improved technique for single chip mounting to multi chip modules and printed wiring boards.

Still a further object of the present invention is to translate a perimeter format on a chip into a compact area array no larger than the area of the chip.

A feature of the present invention is to provide a peripheral to area adapter of the type adapted to receive an integrated circuit, the integrated circuit including a top surface, a bottom surface, and a plurality of conductive terminals positioned along the periphery of the bottom surface, including a dielectric support having an upper surface and a lower surface; a plurality of electrically conductive pads above the upper surface of the support and arranged in a pattern corresponding to the terminals on the integrated circuit, so that the bottom surface of the integrated circuit can be positioned above the upper surface of the support to align, directly contact and bond the terminals to the pads; a plurality of electrically conductive planar reroute lines above the upper surface of the support, each of the reroute lines having a first end at a pad and a second end; a plurality of electrically conductive vertical vias extending from the upper surface of the support to the lower surface of the support, each of the vias positioned directly beneath and electrically connected to the second end of a reroute line; and a plurality of electrical coupling elements in an array pattern on the lower surface of the support, each of the coupling elements having at least a portion directly beneath and electrically connected to a via; wherein the adapter can provide peripheral to area translation for the terminals on the integrated circuit, and all of the peripheral to area translation is performed by the reroute lines.

Another feature of the present invention is wherein the vias are substantially filled with an electrically conductive metal, or alternatively the vias comprise a bore defined by a bore wall extending between the upper and lower surfaces of the support, and an electrically conductive metal formed on the bore wall.

An additional feature of the present invention is wherein the reroute lines fan-in from the pads.

Yet another feature of the present invention is wherein the dielectric support is a rigid ceramic carrier.

An additional feature of the present invention is wherein the pads and reroute lines are fabricated from thin film wiring.

Another feature of the present invention is wherein the pads and reroute lines are formed on a tape-automated-bonding frame.

Still another feature of the present invention is wherein the terminals on the integrated circuit are bumps which protrude from the bottom surface of the integrated circuit.

Yet another feature of the present invention is wherein the adapter is combined with an integrated circuit to form an integrated circuit package.

A further feature of the present invention is wherein a compressible supportive insulator is positioned inside the terminals between the bottom surface of the integrated circuit and the top of the adapter.

Still a further feature of the present invention is wherein an encapsulant surrounds at least the sides of the package between the top surface of the chip and the lower surface of the support, thereby providing a seal for the chip.

Another feature of the present invention is wherein a protective bumper is attached to the sides of the package between the top surface of the chip and the lower surface of the support, thereby providing a mechanical shield for the sides of the chip.

Still another feature of the present invention is wherein a metallic heat transfer plate contacts in heat exchange relationship at least a portion of the top surface of the chip.

A still further feature of the present invention is wherein the adapter is combined with an integrated circuit and an underlying electrical interconnect substrate to form an integrated circuit packaging structure.

An advantage of the present invention is that the adapter may allow for increasing the mechanical and thermal coefficient of expansion (TCE) compatability of a packaging structure by using a support material with substantially the same TCE as the integrated circuit and the substrate.

Other objects, features and advantages of the present invention will be apparent from a review of the detailed description of the preferred embodiments which follows, when taken together with the drawings, a brief description of which follows.

DETAILED DESCRIPTION OF PREFERRED EMBODIMENTS

Figure 1:
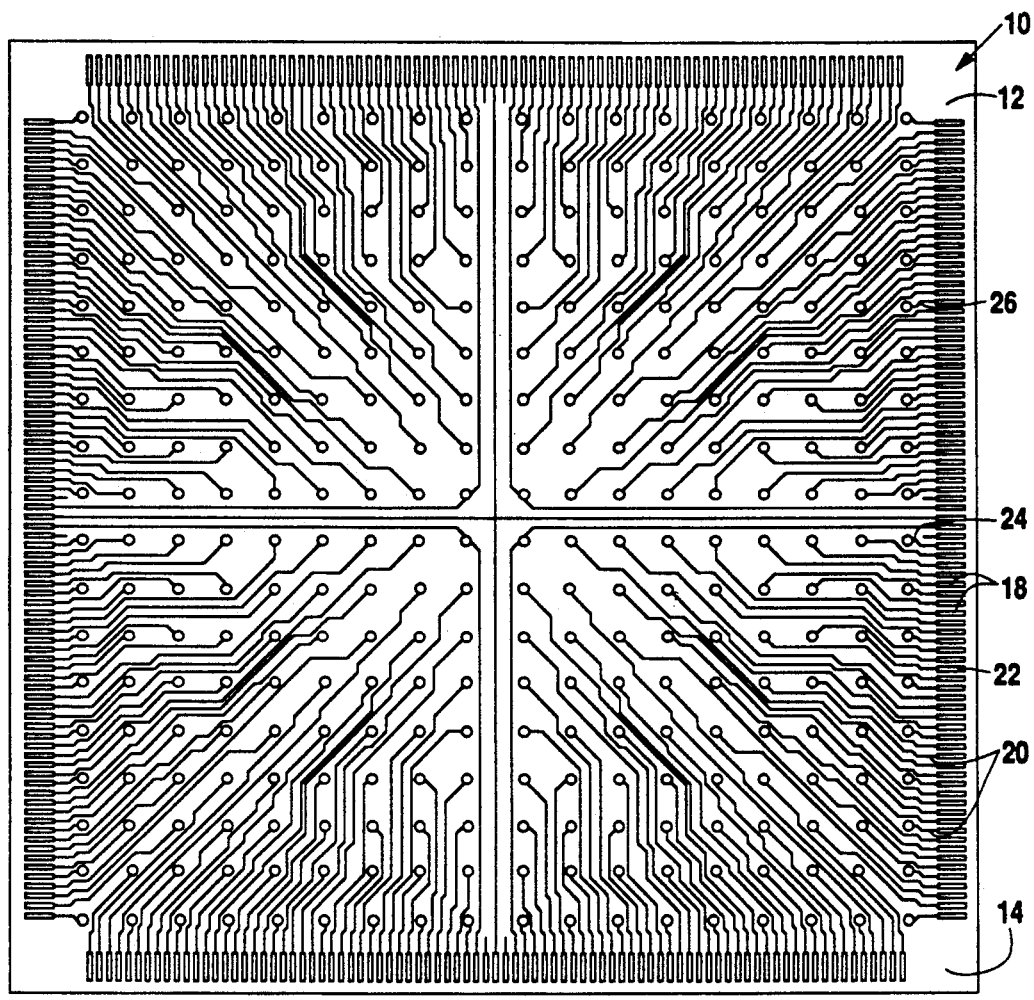
FIG. 1 is a top plan view of a peripheral to area adapter illustrating an embodiment with a rigid dielectric support.

Referring now the the drawings, and particularly to FIG. 1, there is shown a top plan view of a peripheral to area adapter generally designated by reference numeral 10. Adapter 10 comprises a rigid dielectric carrier support 12 with an upper surface 14 and lower surface 16. Suitable rigid dielectrics include silicon, photoceramic, ceramic, alumina, and glass ceramic. A large number of ceramic carriers 12 can be fabricated on a single wafer and then separated by sawing the wafer along scribe lines to form carriers with 600 mil sides. A plurality of electrical contact pads 18 are positioned near the peripheral edges of support 12. Pads 18 are 2 mils wide with a pad pitch of 4 mils (i.e. the pads are spaced by 2 mils with 4 mil center-to-center spacing). The present invention is particularly well suited for high density structures in which at least two of the pads have a pitch of less than 10 mils. Preferably pads 18 contain copper, nickel and gold and may be solder coated to facilitate subsequent bonding as will be described. A plurality of 2 mil wide planar copper conductive reroute lines 20 are also on upper surface 14. Each reroute line 20 comprises an first end 22 which terminates at a pad 18. Each reroute line 20 also comprises second end 24. In the example set forth, second ends 24 fan-in from pads 18 toward the center of upper surface 14. However, it is understood that the second ends 24 of reroute lines 20 could, instead, fan-out away from pads 18 if desired. Fanning-in is preferred since this provides for a compact area array translation. In any event, each connected pad and reroute line acts to customize or personalize the adapter 10 for a specific configuration of terminals on a chip. Returning to the example, each reroute line 20 is separated by a space 26 such as 20 mils from the other reroute lines to assure reroute lines 20 are electrically isolated from one another. Reroute line densities of up to 500 lines per inch are presently realizable by way of fabricating pads 18 and reroute lines 20 with thin film wiring techniques on a ceramic support 12, as will be later described.

Figure 2:
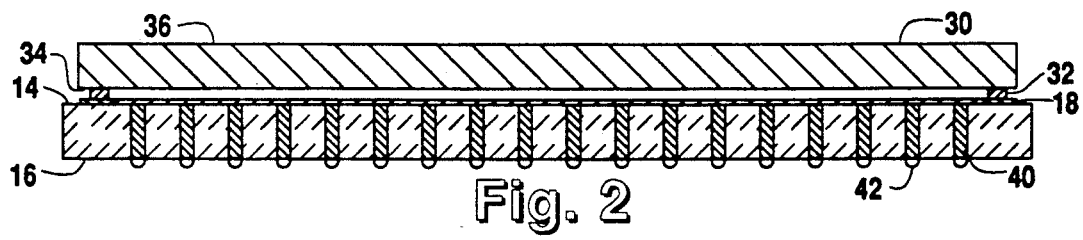
FIG. 2 is a cross-sectional view of the adapter in FIG. 1 further including an integrated circuit chip mounted on the adapter.

With reference now to FIG. 2, there is shown a cross-sectional view of adapter 10 as part of a chip/adapter package. Integrated circuit chip 30 comprises a plurality of conductive terminals 32 positioned along the outer periphery of chip bottom surface 34. In the preferred embodiment, as illustrated herein, terminals 32 are bumps which protrude from surface 34. Alternatively, however, terminals 32 can be in and aligned with surface 34. Chip 30 further includes a plurality of internal circuits (not shown) integrated into a single semiconductor element and electrically coupled to terminals 32. Chip top surface 36 is opposite chip bottom surface 34. Pads 18 on adapter 10 are arranged in a pattern corresponding to terminals 32 so that when chip bottom surface 34 is positioned above support upper surface 14 the terminals 32 and pads 18 can be aligned, directly contacted and electrically coupled or bonded in a one-to-one relationship. Flip-chip attachment of a chip to a mating set of pads is well known in the art, see for instance U.S. Pat. No. 4,926,241 by Carey which is hereby incorporated by reference. Thermocompression is the preferred bonding technique. Solder reflow is also acceptable, as is adhesive bonding. Adhesive bonding would be preferred when terminals 32 are in and aligned with surface 34 of the chip. The use of an adhesive material for bonding electrical contacts together is known in the art, see, for instance, U.S. Ser. No. 07/631,296 filed Dec. 20, 1990 by MacKay; K. Sakuma et al., "Chip on Glass Technology With Standard Aluminized IC Chip", *International Society For Hybrid Microelectronics Conference Proceedings*, Chicago, Ill., Oct. 13, 1990, pp. 250-256; and P. Hogerton et al., "Investigations Into The Use Of Adhesives For Level-1 Microelectronic Interconnections", *Materials Research Society Symposium Proceedings*, Vol. 154, San Diego, Calif., Apr. 24, 1989, pp. 415-424; the disclosures for which are hereby incorporated by reference. Or pads 18 and terminals 32 Could be welded together by directing a laser beam at the terminal/pad interface as described in U.S. Pat. No. 4,845,335 to Andrews et al. which is hereby incorporated by reference. Laser bonding has the advantage of coupling laser energy to the bond without substantially heating the adapter or the chip, but is far more complex than other conventional bonding techniques.

For each second line end 24, there is positioned beneath and electrically connected an electrically conductive vertical via 40 with a 10 mil diameter extending from support upper surface 14 to support lower surface 16. Openings for vias 40 can be formed by mechanically punching through-holes in a ceramic wafer before separating the individual supports 12. Vias 40 are formed by filling an electrically conductive metal into the holes. Alternatively, vias 40 can comprise a bore defined by a bore wall with an electrically conductive metal formed on the bore wall. In either case, the electrical conductor vias 40 are separated by the dielectric. The choice of conductive metals for vias 40 may depend on the nature of the ceramic. For standard high temperature fired ceramics, tungsten or other refractory metals are preferred. But for lower temperature firing ceramics such as glass ceramic, copper or gold are preferred. If desired, a subset of vias 40 can be used as power or ground vias, and/or a capacitor (not shown) can be fabricated in support 12 with its electrodes connected to selected vias.

For each via 40, there is electrically connected an electrical coupling element 42 on adapter lower surface 16, preferably protruding below lower surface 16. Each coupling element 42 has at least a portion directly beneath an individual via 40. Thus adapter 10 provides peripheral to area translation for chip 30 by electrically interconnecting each peripheral chip terminal 32 to an electrical coupling element 42 beneath the adapter. Preferably coupling elements 42 form a grid array pattern that fits within the area covered by chip 30. The array pattern also allows coupling elements 42 to have a substantially larger bonding area than terminals 32.

For instance, suppose a chip has a square top surface with 400 mil sides and 400 I/O terminals. An efficient terminal configuration might position 100 terminals per side, with each terminal 2 mils in width and spaced 2 mils from adjacent terminals. The present invention adapter can translate this terminal configuration into an array, within the area of the chip, containing 20 rows of coupling elements having sides 20 mils in width and length, and 20 mil spaces between adjacent coupling elements. In addition, the present invention adapter allows chips with widely varying terminal configurations to be conveniently connected to a generic substrate adapted to receive a standard area grid. That is, the present invention adapter 10 can utilize top surface metallization (pads 18 and planar reroute lines 20) customized for a particular chip 30, while also employing a support 12, vias 40, and coupling elements 42 fabricated to standard dimensions with standard materials.

Figure 3:
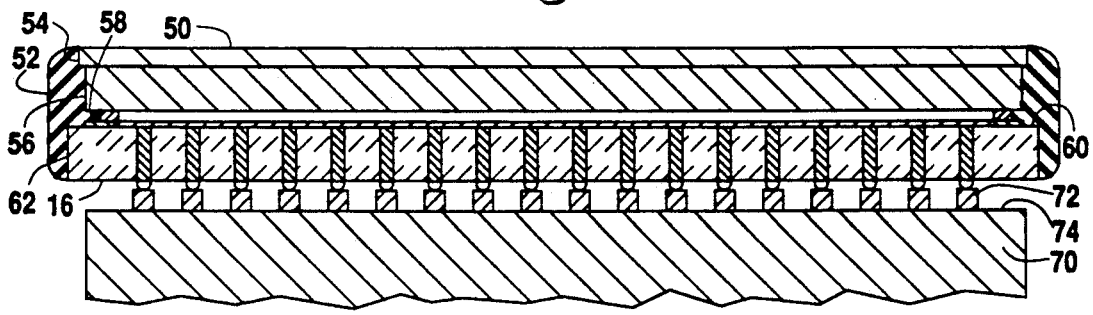
FIG. 3 is a cross-sectional view similar to FIG. 2 further including a heat transfer plate contacting the chip, a protective bumper surrounding the sides the adapter and chip to provide mechanical protection, and a substrate beneath the adapter.

Referring now to FIG. 3, a cross-sectional view of the present invention similar to FIG. 2 is shown. An optional metallic heat transfer plate 50 contacts the top surface 36 of chip 30 in heat exchange relationship to improve the removal of heat generated by chip 30. Plate 50 can be 20 mils of copper-tungsten or kovar.

If desired, a protective bumper 52 such as rubber or silicone can be applied to the sides of the structure to provide a mechanical fender for the adapter 10 and chip 30, particularly if the sides or edges of chip 30 are mechanically fragile. As shown, protective bumper 52 is applied over heat plate sidewalls 54, chip sidewalls 56, terminal outer sidewalls 58, outer portion 60 of support 12 beyond terminal outer sidewalls 58, and support sidewalls 62. Protective bumper 52 should cover at least between top 36 of chip 30 and bottom surface 16 of adapter 12 to assure chip outer sidewalls 56 are mechanically shielded.

An integrated circuit packaging structure of the present invention can further include an electrical interconnect substrate 70 such as the high-density high-performance customizable copper/polyimide structure disclosed in European patent application no. 88308996.3 by Carey. Substrate 70 comprises a plurality of gold coated nickel bond sites 72 protruding from the substrate top surface 74 arranged in a pattern corresponding to coupling elements 42 so that each coupling element 42 can be aligned with and directly contact a separate bond site 72. That is, bond sites 72 are arranged in the same array pattern as coupling elements 42. Coupling elements 42 can then be bonded to bond sites 72 by numerous well known techniques. If solder reflow is used then tin plated copper bond sites 72 are preferred since gold tends to leach into solder.

Figure 4:
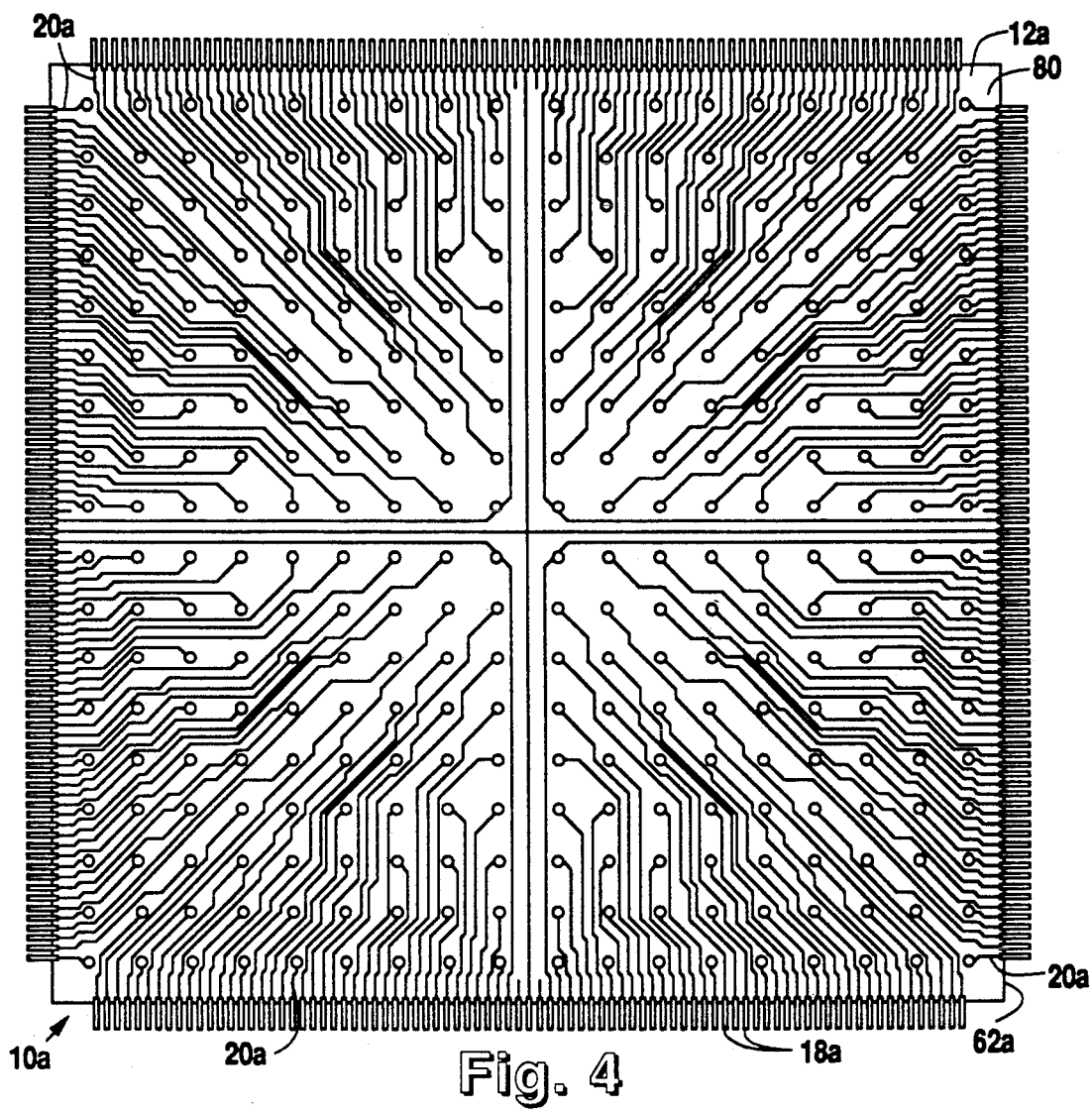
FIG. 4 is a top plan view of a peripheral to area adapter illustrating an embodiment with a flexible TAB dielectric support.
Figure 5:
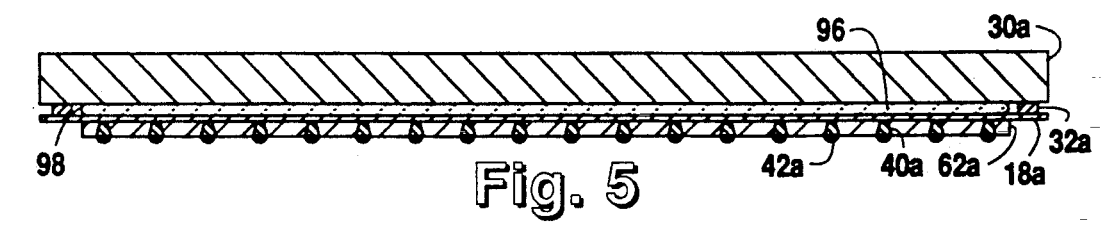
FIG. 5 is a cross-sectional view of the adapter in FIG. 4 further including an integrated circuit chip mounted on the adapter and a compressible supportive insulator between the adapter and the chip.
Figure 6:
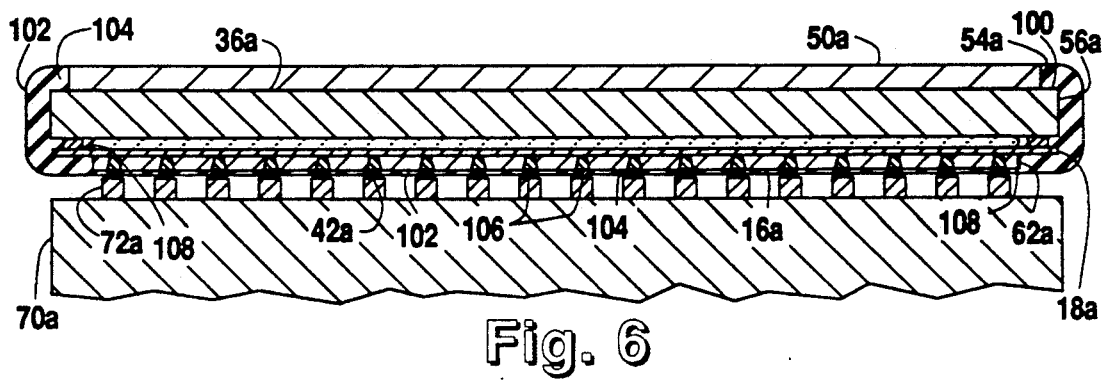
FIG. 6 is a cross-sectional view similar to FIG. 5 further including a heat transfer plate contacting the top of the chip, an encapsulant covering a portion of the adapter and chip to provide a seal for the chip, and a substrate beneath the adapter.

With reference now to FIGS. 4-6, there is seen another embodiment of the present invention wherein like parts to FIGS. 1-3 are similarly numbered with the addition of the suffix "a" and are identical unless otherwise specified.

Referring now to FIG. 4, in this embodiment the support 12a is a thin (25 micron) flexible TAB tape 80. Pads 18a extend beyond outer sidewalls 62a. Reroute lines 20a are shown as fanning in, however, it may be desirable to further include a plurality of electrical test sites (not shown) at a second end of additional lines 20a which fan-out from pads 18a.

With reference now to FIG. 5, coupling elements 42a are shown as wider that reroute lines 20a. Consequently, vias 40a are formed in a vertical pyramid-like shape. In addition, a compressible supportive insulator 96 can be sandwiched between the flexible adapter 10a and chip 30a inside terminals 32a to provide mechanical support. Suitable insulators 96 include silcone, rubber, or an elastomeric polymer foam. The surface area of supportive insulator 96 is approximately the same as support 80 to allow supportive insulator outer sidewalls 98 to align with support outer sidewalls 62a. Supportive insulator 96 must be thin enough to permit pads 18a to contact terminals 32a, yet must be thick enough to contact adapter upper surface 14a and chip bottom surface 34a in order to reduce the pressure and stress upon pads 18a and terminals 32a.

Referring now to FIG. 6, if a seal is desired, outer sidewalls 54a of heat transfer plate 50a can be spaced a small distance from sidewalls 56a of chip 30a thereby leaving an end portion 100 of chip top surface 36a uncovered. Then an encapsulant 102 such as 100 mils of molded plastic can be applied over heat plate sidewalls 54a, chip top surface portions 100, chip sidewalls 56a, the bottom of pads 18a, support sidewalls 62a, adapter lower surface 16a and lower portions 104 of coupling elements 42a. That is, encapsulant 102 covers the entire packaging structure except for at least a portion of heat transfer plate 50a, and at least upper portions 106 of coupling elements 42a which protrude from encapsulant 102. Encapsulant 102 can also fill regions 108 between compressible supportive insulator 96 and terminals 32a. If no heat transfer plate is used then encapsulant 102 can cover the entire top surface 36a of chip 30a. In either case the 100 mil thickness of encapulant 102 will not substantially increase the size of the chip/adapter package. The chip/adapter package can be mounted on pads 72a of interconnect substrate 70a as previously described.

Figure 7:
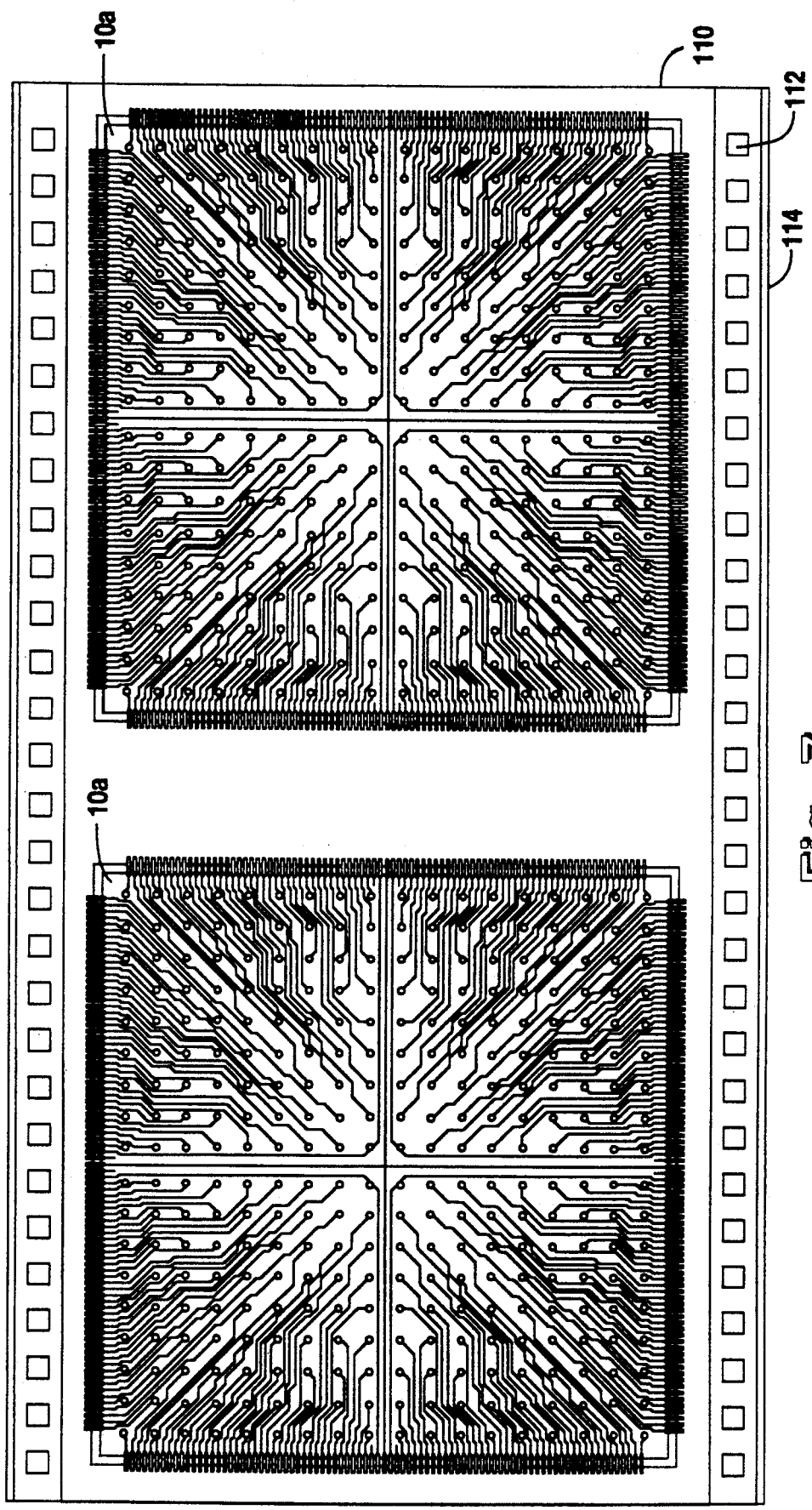
FIG. 7 is a top plan view of similar to FIG. 4 illustrating a plurality of TAB adapters on a reel of tape.

Referring now to FIG. 7, there is shown a top plan view of a plurality of adapters 10a fabricated on a tape-automated-bonding (TAB) tape frame 110. Tape 110 is produced in reel-to-reel form and includes sprocket holes 112 adjacent tape outer edges 114 to provide for advancing and aligning the tape.

Figure 8:
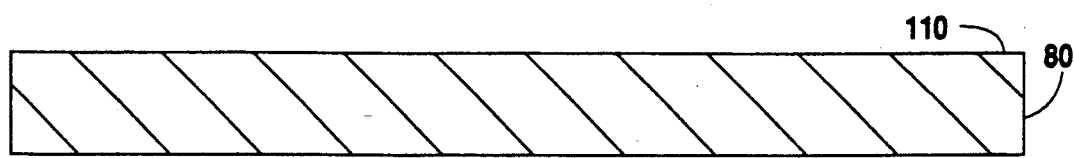
FIGS. 8-14 are cross-sectional views of a sequential manufacturing steps for the present invention adapter.
Figure 9:
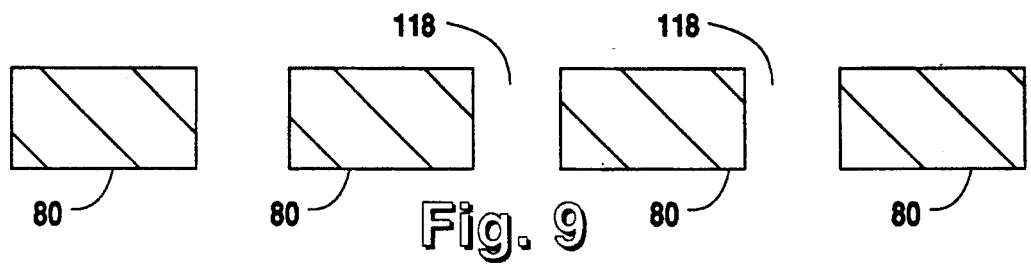
Figure 10:
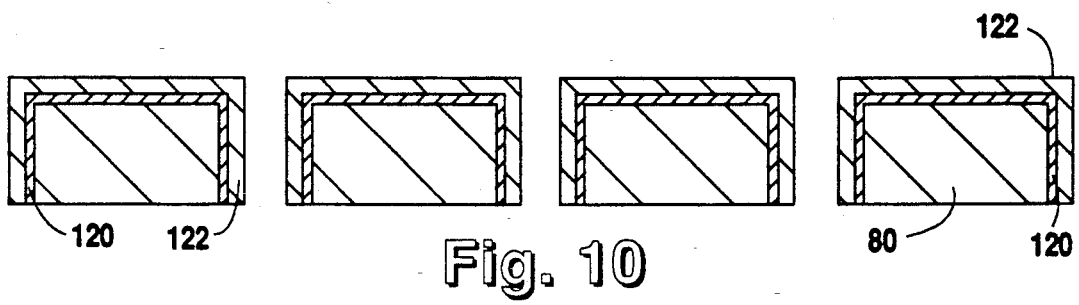
Figure 11:
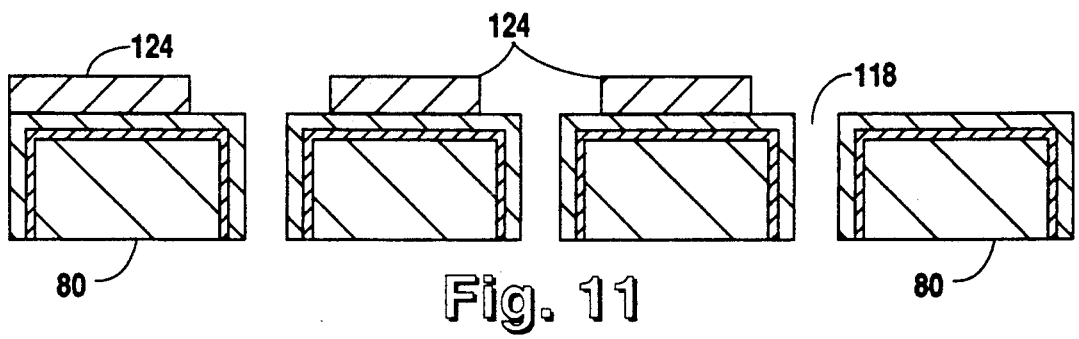
Figure 12:
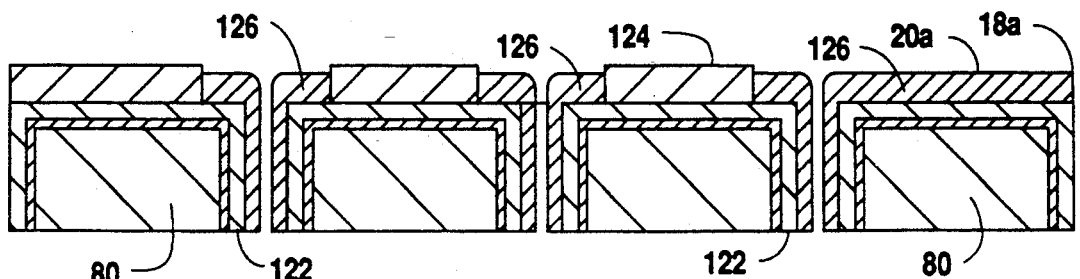
Figure 13:
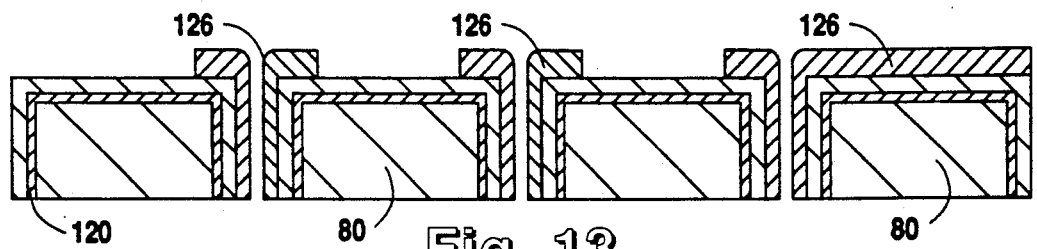
Figure 14:
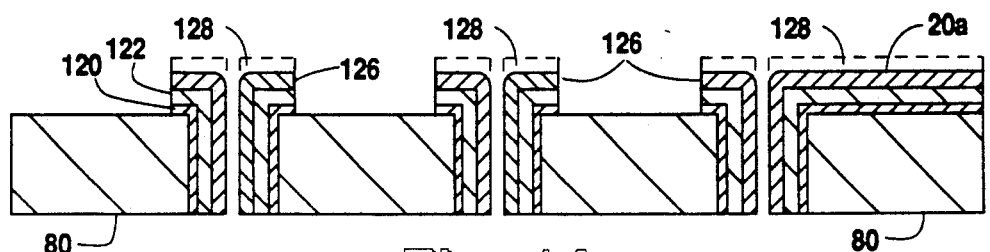

Referring now to FIGS. 8-14, a method of manufacturing the present invention adapter 10a is now described. In FIG. 8 a 25 micron thick polyimide layer forms support 80 of tape 110. In FIG. 9 holes 118 are punched or etched through support 80 to create openings for vias 40a. In FIG. 10 a 500 angstrom adhesion layer of chrome 120 is deposited over support 80 which is in turn covered by 2500 angstroms of copper 122. In FIG. 11 photoresist mask 124 covers selected portions of adapter 10a outside holes 118, and in FIG. 12 a 0.5 mil copper (or substantially copper) layer 126 is electroplated over the exposed portions of layer 122 to form pads 18a, reroute lines 20a and vias 40a. In FIG. 13 mask 124 is stripped. In FIG. 14 the entire surface is "flash-etched" to remove the uncovered regions of layers 120 and 122. This flash-etch will also remove a top portion 128 (shown as broken lines) from pads 18a and reroute lines 20a, but such top portion will be negligible since layer 126 is much thicker than layers 120 and 122. Additional details for TAB tape fabrication are well known to those having skill in the art and will not be detailed herein; see, for instance, U.S. Pat. No. 4,860,088 by Smith et al., the disclosure for which is incorporated by reference. After a plurality of adapters 10a are formed they can be excised from tape 110 prior to bonding to a chip 30a.

Figure 15:
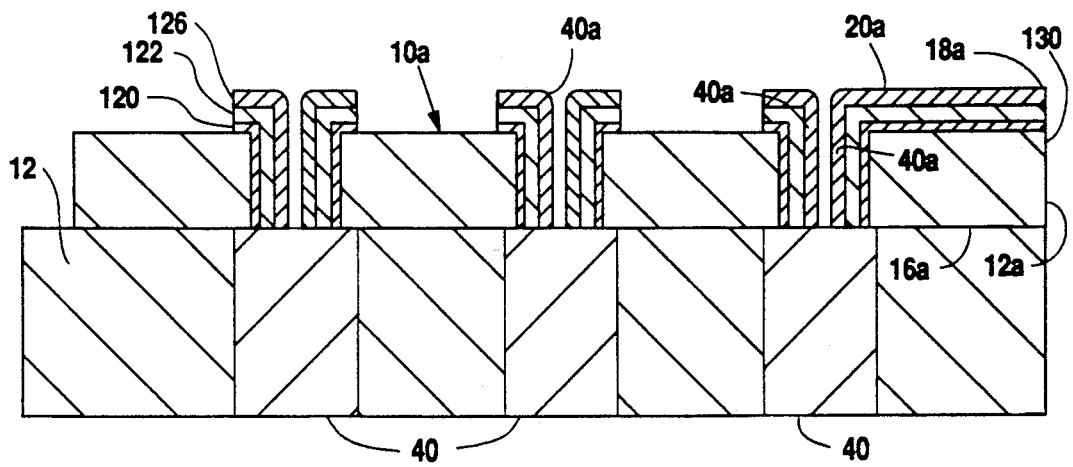
FIG. 15 is a cross-sectional view similar to FIG. 14 showing another embodiment of the present invention.

Referring now to FIG. 15, another embodiment for the method of manufacturing the present invention in FIGS. 8-14 is now described. In this embodiment, adapter 10a serves as an upper thin film wiring layer for a thick, rigid support 12 by repeating steps in FIGS. 8-14 on an underlaying rigid support 12. That is, adapter 10a can be considered an upper dielectric layer 130 of support 12. Layer 130 includes upper pads 18a and reroute lines 20a on the top surface, and upper vias 40a therethrough. If desired, upper coupling elements 42a (not shown) may protrude from the bottom 16a of support 12a at vias 40a. The tops of vias 40 in rigid support 12 are preferably at least twice as wide as the bottoms of upper vias 40a in order to facilitate alignment and direct contact between vias 40 and 40a.

The present invention adapter provides for a plurality of chips to be densely packaged on a substrate and electrically interconnected to one another. However, it may be advantageous to test various electrical interconnections prior to testing the final packaging structure. A connection hierarchy of chip to adapter and adapter to substrate allows for incrementally testing the chip to adapter bonds (between pads 18 and terminals 32) before bonding the adapter to the substrate (coupling elements 42 to bond sites 72).

The thermal coefficient of expansion (TCE) for the adapter and one or both of the integrated circuit and substrate can be substantially matched by the appropriate choice of materials; such as by using silicon in the integrated circuit and silicon (or glass or glass ceramics with TCEs similar to silicon) in the adapter and the substrate.

Numerous variations of the previously described embodiments are apparent to those with skill in the art. For instance, the protective bumper could be used with a rigid carrier support and the molded plastic seal could be used with a TAB carrier support.

The present invention, therefore, is well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. An integrated circuit chip package, comprising:
   a single integrated circuit chip including a plurality of internal circuits integrated into a single semiconductor element, a top surface and a bottom surface, and a plurality of conductive terminals, each of the terminals being positioned along the periphery of the bottom surface and entirely within the area covered by the integrated circuit chip to provide electrical coupling to the internal circuits;
   a dielectric support having an upper surface and a lower surface;
   a plurality of electrically conductive pads at least partially on the upper surface of the support positioned adjacent to the peripheral edges of the support and arranged in a pattern corresponding in one-to-one relationship to the terminals on the integrated circuit chip so that the bottom surface of the integrated circuit chip is positioned above the upper surface of the support and the terminals are aligned with and bonded to the pads, thereby mounting the integrated circuit chip on the upper surface of the support;
   a plurality of electrically conductive planar reroute lines, each of the reroute lines having a first end which is a pad, a second end spaced from the first end, and disposed on the upper surface of the support from the portion of the pad on the upper surface of the support to the second end;
   a plurality of electrically conductive vertical vias extending from the upper surface of the support to the lower surface of the support, each of the vias positioned directly beneath and electrically connected to the second end of a reroute line;

a plurality of electrical coupling elements in an array pattern on the lower surface of the support, each of the coupling elements entirely within the area covered by the integrated circuit chip and having at least a portion directly beneath and electrically connected to a via; and a protective bumper attached to the sides of the package between the top surface of the integrated circuit chip and the lower surface of the support;

wherein all of the peripheral to area translation between the terminals and the coupling elements is performed by the reroute lines, all of the vertical translation between the upper and lower surfaces of the support is performed by the vias which are connected to the second ends of the reroute lines and to the coupling elements, and the bumper provides a mechanical shield for the sides of the integrated circuit.

2. The package of claim 1, further comprising a compressible supportive insulator positioned inside the terminals between the bottom surface of the integrated circuit chip and the upper surface of the support.

3. The package of claim 2 wherein the compressible supportive insulator is selected from the group consisting of silicone, rubber and elastomeric polymer foam.

4. The package of claim 1, further comprising an encapsulant that surrounds the sides of the package between the top surface of the integrated chip circuit and the lower surface of the support, thereby providing a seal for the integrated chip circuit.

5. The package of claim 4, wherein the encapsulant is molded plastic.

6. The package of claim 5, wherein the protective bumper is selected from the group consisting of rubber and silicone.

7. The package of claim 1, further comprising a metallic heat transfer plate contacting at least a portion of the top surface of the integrated chip circuit in heat exchange relationship.

8. The package of claim 7, wherein the metallic heat transfer plate is selected from the group consisting of copper-tungsten and kovar.

9. The package of claim 1, wherein the integrated chip circuit and the support have substantially matching thermal coefficients of expansion.

10. The package of claim 1, wherein a substantial portion of the integrated circuit chip and the support contains the same material, thereby substantially matching the thermal coefficients of expansion in the integrated circuit chip and the support.

11. The package of claim 10 wherein said same material is silicon.

12. The adapter of claim 1, wherein the terminals are bumps which protrude from the bottom surface of the integrated chip circuit.

13. A method of manufacturing a peripheral to area adapter of the type adapted to receive an integrated circuit, the integrated circuit including a top surface, a bottom surface, and a plurality of conductive terminals, each of the terminals being positioned along the periphery of the bottom surface and entirely within the area covered by an integrated circuit chip, comprising:

providing a flexible dielectric support having an upper surface and a lower surface;

forming a plurality of vertical holes in the support between the upper and lower surfaces of the support;

forming a plurality of electrically conductive vertical vias which extend from the upper surface to the lower surface by providing an electrical conductor inside each hole in the support;

forming a plurality of electrically conductive pads at least partially on the upper surface of the support positioned adjacent to the peripheral edges of the support and customized in a pattern corresponding in one-to-one relationship to the terminals on a particular integrated circuit chip so that the bottom surface of an integrated circuit chip can be positioned above the upper surface of the support to align, directly contact and bond the terminals to the pads;

forming a plurality of electrically conductive planar reroute lines, each of the reroute lines having a first end which is a pad, a second end spaced from the first end, and disposed on the upper surface of the support from the portion of the pad on the upper surface of the support to the second end, wherein each of the vias has at least a portion directly beneath and electrically connected to the second end of a reroute line;

forming a plurality of electrical coupling elements in an array pattern on the lower surface of the support, each of the coupling elements in an array pattern on the lower surface of the support, each of the coupling elements entirely within the area of the integrated circuit chip and having at least a portion directly beneath and electrically connected to a via; and attaching a protective bumper to the sides of the package between the top surface of the integrated circuit chip and the lower surface of the support, thereby providing a mechanical shield for the integrated circuit chip;

wherein all of the peripheral to area translation between the terminals and the coupling elements is performed by the reroute lines and all of the vertical translation between the upper and lower surfaces of the support is performed by the vias which are connected to the second ends of the reroute lines and to the coupling elements.

14. The method of claim 13 wherein the dielectric support is a tape-automated-bonding frame and the pads and reroute lines are copper.

15. The method of claim 13, further comprising attaching the protective bumper to the bottom surface of the chip in the regions outside the terminals and the upper surface of the support in the regions outside the pads.

16. The method of claim 15, further comprising attaching the protective bumper to the sides of the terminals and pads facing away from the center of the upper surface of the support without covering the top surface of the chip or the lower surface of the support.

17. The method of claim 13, wherein the protective bumper is selected from the group consisting of rubber and silicone.

18. An adapter package providing peripheral to area translation and mechanical protection for an integrated circuit chip, comprising:

a single integrated circuit chip having a plurality of conductive terminals;

a dielectric support;

a plurality of electrically conductive pads at least partially on the upper surface of the support and bonded in one-to-one relationship to the terminals thereby mounting the chip on the support;

a plurality of electrically conductive planar reroute lines, each reroute line having a first end which is a pad, a second end spaced from the first end, and disposed on the upper surface of the support from the portion of the pad on the upper surface of the support to the second end;

a plurality of electrically conductive vertical vias extending from the upper and lower surfaces of the support, each of the vias positioned directly beneath and electrically connected to the second end of a reroute line;

a plurality of coupling elements in an array pattern on the bottom surface of the support, each coupling element having at least a portion directly beneath and electrically connected to a via such that each terminal is electrically connected to a coupling element; and a protective bumper attached to the sides of the package between the top surface of the chip and the lower surface of the support wherein the bumper provides a mechanical shield for the sides of the chip.

19. The adapter package of claim 18 wherein each terminal is electrically connected to a single pad, reroute line, via and coupling element.

20. The adapter package of claim 18 wherein the reroute lines provide all peripheral to area translation between the terminals and the coupling elements, and the vias provide all vertical translation between the terminals and the coupling elements.

21. The adapter package of claim 18 wherein the terminals, pads, reroute lines, vias and coupling elements are entirely within the area covered by the chip.

22. The adapter package of claim 18 wherein the support is entirely within the area covered by the chip.

23. The adapter package of claim 18 wherein:
the bottom surface of the chip faces the upper surface of the support;
the terminals are disposed on the bottom surface of the chip;
the terminals are aligned with and bonded directly to the pads; and
the second ends of the reroute lines are closer to the center of the upper surface of the support than the first ends.

24. The adapter package of claim 18 wherein the protective bumper is also attached to the bottom surface of the chip in the regions outside the terminals, the upper surface of the support in the regions outside the pads, and the sides of the terminals and pads facing away from the center of the upper surface of the support.

25. The adapter package of claim 18 wherein the protective bumper is selected from the group consisting of rubber and silicone.

26. An adapter package providing peripheral to area translation and mechanical protection for an integrated circuit chip, comprising:

a single integrated circuit chip having a plurality of conductive terminals disposed on the bottom surface;

a dielectric support having an upper surface facing the bottom surface of the chip;

a plurality of electrically conductive pads at least partially on the upper surface of the support, aligned with and bonded in one-to-one relationship to the terminals thereby mounting the chip on the support;

a plurality of electrically conductive planar reroute lines, each reroute line having a first end which is a pad, a second end spaced from the first end and closer to the center of the upper surface of the support than the first end, and disposed on the upper surface of the support from the portion of the pad on the upper surface of the support to the second end;

a plurality of electrically conductive vertical vias extending from the upper and lower surfaces of the support, each of the vias positioned directly beneath and electrically connected to the second end of a reroute line;

a plurality of coupling elements in an array pattern on the bottom surface of the support, each coupling element having at least a portion directly beneath and electrically connected to a via; and a protective bumper attached to the sides of the package between the top surface of the chip and the lower surface of the support;

wherein each terminal is electrically connected to a single pad, reroute line, via and coupling element, the terminals, pads, reroute lines, vias and coupling elements are entirely within the area covered by the chip, the reroute lines provide all peripheral to area translation between the terminals and the coupling elements, the vias provide all vertical translation between the terminals and the coupling elements, and the bumper provides a mechanical shield for the sides of the chip.

* * * * *